United States Patent
Sugawara et al.

(10) Patent No.: US 7,102,897 B2
(45) Date of Patent: Sep. 5, 2006

(54) CIRCUIT BOARD MODULE, CIRCUIT BOARD CHASSIS AND ELECTROMAGNETIC SHIELDING PLATE THEREFOR

(75) Inventors: Tsukasa Sugawara, Hitachinaka (JP); Akira Fujii, Mito (JP); Hajime Shimada, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/834,856

(22) Filed: Apr. 30, 2004

(65) Prior Publication Data

US 2004/0228102 A1 Nov. 18, 2004

(30) Foreign Application Priority Data

May 14, 2003 (JP) .............................. 2003-135257

(51) Int. Cl.
*H05K 9/00* (2006.01)
(52) U.S. Cl. ....................... 361/818; 361/800; 361/816; 174/35 R; 174/35 GC
(58) Field of Classification Search ........ 361/796–800, 361/816, 818, 752, 753, 756; 174/35 R, 174/35 GC
See application file for complete search history.

(56) References Cited

U.S. PATENT DOCUMENTS 5,708,552 A * 1/1998 Han et al. .................... 361/799
5,746,326 A * 5/1998 Hong ....................... 211/41.17
5,930,120 A * 7/1999 Gunther et al. ............. 361/800
6,134,119 A * 10/2000 Gunther et al. ............. 361/800
6,327,155 B1 * 12/2001 Niepmann et al. .......... 361/757
6,395,976 B1 * 5/2002 Koradia et al. ........ 174/35 GC
6,449,171 B1 * 9/2002 Karnes ....................... 361/796
6,483,023 B1 * 11/2002 Jacques ................. 174/35 GC
6,519,162 B1 * 2/2003 Witty et al. ................. 361/796
6,538,903 B1 * 3/2003 Radu et al. ................. 361/818
6,879,496 B1 * 4/2005 Marshall et al. ............ 361/818

FOREIGN PATENT DOCUMENTS

JP      3-88396     4/1991
JP      8-250886    9/1996

* cited by examiner

*Primary Examiner*—Randy W. Gibson
*Assistant Examiner*—Dameon E. Levi
(74) *Attorney, Agent, or Firm*—Dickstein Shapiro LLP

(57) ABSTRACT

The disclosure is concerned with An electromagnetic shielding plate comprising an electromagnetic shielding member of electrical conductivity and a front panel disposed to an end of the electromagnetic shielding member. The disclosure is also concerned with a circuit board chassis, which comprises a casing, guide rails disposed in the inside of the casing for inserting circuit boards and a plurality of electromagnetic shielding plates each comprising an electromagnetic shielding member and a front panel, the electromagnetic shielding plates being located between the circuit boards, wherein the electromagnetic shielding plates and the casing are electrically connected by means of front panels.

24 Claims, 5 Drawing Sheets

CIRCUIT BOARD MODULE, CIRCUIT BOARD CHASSIS AND ELECTROMAGNETIC SHIELDING PLATE THEREFOR

CLAIM OF PRIORITY

The present application claims priority from Japanese application serial No. 2003-135257, filed on May 14, 2003, the content of which is hereby incorporated by reference into this application.

DESCRIPTION OF THE INVENTION

1. Field of the Invention

The present invention relates to a circuit board module having a plurality of circuit boards, a chassis for mounting a plurality of circuit boards arranged in parallel with each other in a casing and to an electromagnetic shielding plate for shielding the circuit boards from electromagnetic wave.

2. Related Art

As an example of a technology relating to electromagnetic shielding of a circuit board casing, a structure in which an electromagnetic shielding plate is disposed in the front face of the casing as disclosed in Japanese Patent Laid-open Hei 3-088396; however, the electromagnetic shielding between the circuit boards in the casing is not considered in the technology disclosed in the patent publication.

There is another example wherein an electrically conductive plate is disposed below the circuit boards in parallel with the circuit boards through spacers, thereby to shield electromagnetic noise between the circuit boards, as disclosed in Japanese Patent laid-open Hei 8-250886. The electromagnetic shielding member and the casing disclosed in the patent publication are electrically connected through electrically conductive guide rails in this structure. Accordingly, in case of casings in accordance with standards such as VME (Versa Module Europe, which is the standard of IEEE), wherein the guide rails are made of an insulating material, it is necessary to replace the guide rails with electrically conductive materials or to provide shield-fingers for electrically connecting the guide-rails with each other. This structure results in difficulty of application and increase in a production cost.

Since the electric conductivity between the plate member and the casing, which is earthed, depends on the contact between the shielding and the shield-fingers, there is a fear that the electric conduction of the plates becomes unstable, and there is instability in a long period of time. Further, it is necessary to alter the plate members of the circuit boards which are installed in the casing on the market in accordance with standards such as VME, thereby to form apertures in the plate members for fixing the spacers, which results in a further increase in a production cost.

SUMMARY OF THE INVENTION

It is an object of the present invention to provide a circuit board module having a plurality of circuit boards, a circuit board chassis for accommodating a plurality of circuit boards and a plurality of electromagnetic shielding plates and the electromagnetic shielding plate having stable and secure electromagnetic shield effect in a long period of time.

In order to attain the object mentioned-above, one aspect of the present invention is concerned with a circuit board module comprising a casing having a space for accommodating a plurality of circuit boards and a plurality of electromagnetic shielding plates, wherein the bottom wall of the casing has a plurality of guide rails in parallel with each other, whereby the inserted circuit boards and electromagnetic shielding plates are held in the casing. According to this structure, the electromagnetic noise entering into the casing and emitted from the circuit boards are effectively shielded. Another aspect of the present invention provides a circuit board chassis having the casing. Further, another aspect of the present invention provides an electromagnetic shielding plate for use in the module and chassis.

DETAILED DESCRIPTION OF THE EMBODIEMNTS

Figure 1:
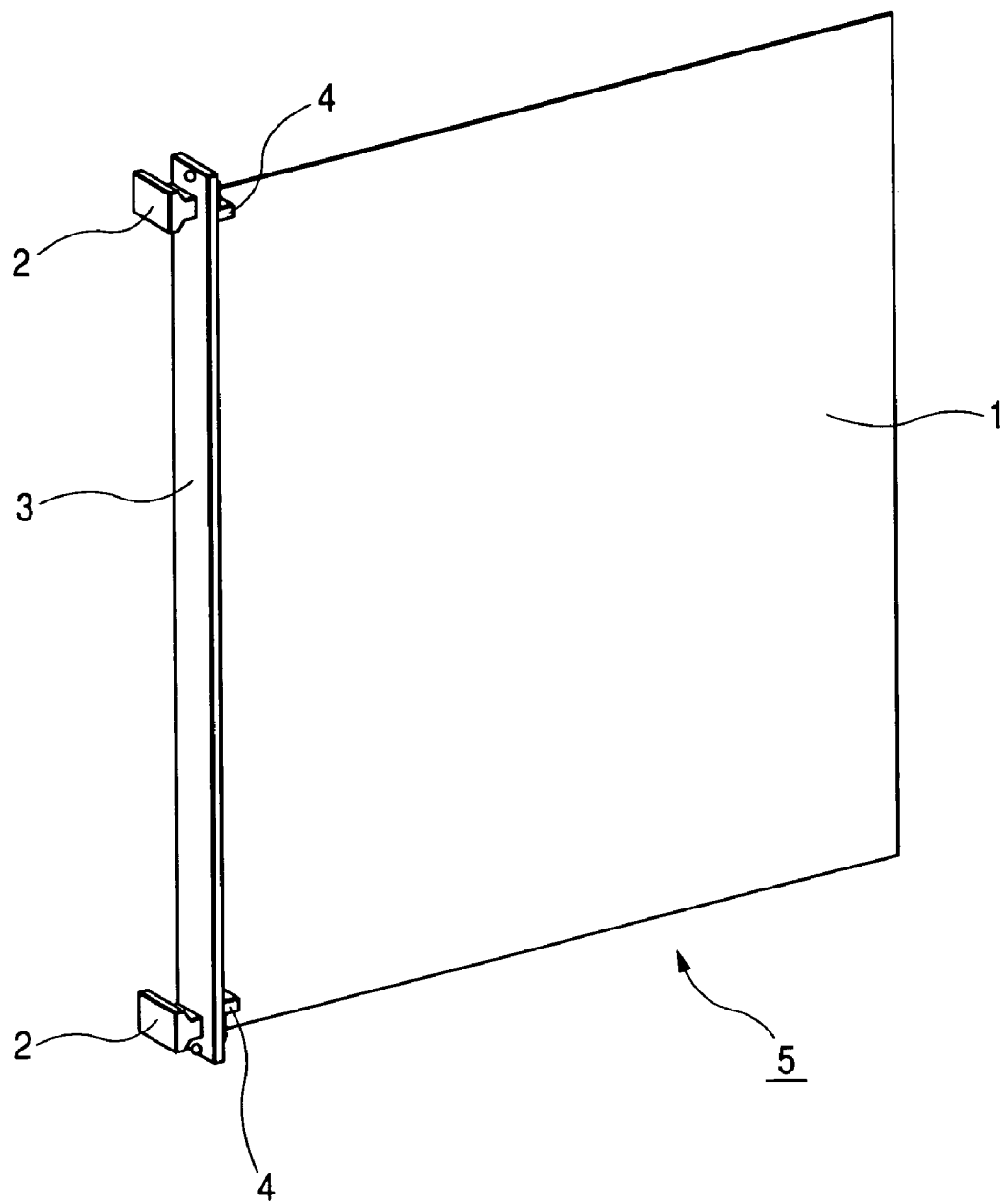
FIG. 1 is a perspective view of an electromagnetic shielding plate of a first embodiment of the present invention.

According to the present invention, there is proposed a circuit board module, which comprises a chassis comprising a casing, guide rails disposed on the bottom face of the inside of the casing for inserting circuit boards, a plurality of electromagnetic shielding plates. Each of the shielding plates comprises an electromagnetic shielding member and a front panel fixed to one end of the electromagnetic shielding member and a plurality of circuit boards each mounting electronic components, being located between the electromagnetic shielding plates and being fitted in each of the guide rails. The electromagnetic shielding plates and the casing are electrically connected by means of the front panels.

The circuit board module proposed by the present invention comprises a casing constituted by top and bottom walls, a pair of side walls and a back board to form a rectangular space in a cross sectional area or a rectangular parallelopiped, the bottom wall having guide rails in parallel with each other, and the back board having fitting members extending in the vertical direction, in aligned relation with the guide rails, a plurality of circuit boards fitted in the guide rails and the fitting members, and a plurality of electromagnetic shielding plates. The electro-conductive front panels 3 disposed at one end of the electromagnetic shielding plates and the circuit boards are arranged side by side to constitute an electro-conductive panel as a whole. The front panels of the electromagnetic shielding plates and the circuit boards are electrically connected with the casing.

Each of the shielding plates has an electromagnetic shielding members extending over substantially the whole length of the circuit boards to cover the circuit boards, the plates being fixed in the guide rails and the fitting members and inserted between the circuit boards thereby to shield the circuit boards, wherein the casing and the plates are electrically connected. The guide rails may be made of an electrically conductive material, although they can be made of an insulating material. The circuit boards carry electronic components (not shown) on one or both sides thereof.

Examples of the aspects of the present invention are as follows:

In the above structures of the circuit board module, the casing is constituted by a top wall, a bottom wall to which guide rails for guiding the circuit boards are provided, two side walls and a back board, whereby a rectangular space for accommodating the circuit boards is formed in the casing, wherein the back board have a plurality of fitting members arranged in parallel with each other, aligned with the guide rails and extending in the vertical direction, thereby to hold the circuit boards and the electromagnetic shielding plates in the casing.

In the above structures of the circuit board module, each of the electromagnetic shielding members has a plan area covering substantially the whole plan area of each of the circuit boards, when the circuit boards are held in the casing.

In the above structures of the circuit board module, each of the front panels has a stripe form fixed to one end of the shielding member and extending in the vertical direction, a pair of handles being disposed at a top and bottom points of the stripe.

In the above structures of the circuit board module, the electromagnetic shielding member is provided with a plurality of apertures each having a diameter not larger than ¼ the wavelength of the electromagnetic noise to be shielded.

In the structures of the circuit board module, the electromagnetic shielding member is a plate member plated with an electrically conductive plating.

In the above structures of the circuit board module, the electromagnetic shielding member is a plate to which an electrically conductive sheet is adhered.

The present invention further provides a circuit board chassis, some examples of which are as follows:

The circuit board chassis, which comprises a casing constituted by a top wall, a bottom wall, two side walls and a back board to form a space, the bottom wall being provided with a plurality of guide rails in parallel with each other with a gap, and a plurality of electromagnetic shielding plates to be inserted in the casing by means of the guide rails. Each of the electromagnetic plates comprises an electromagnetic member and a front panel fixed to one end of the electromagnetic shielding member by means of fixing members at the top and bottom positions of the front panel. The front panels and the casing are electrically connected.

In the above structure of the circuit board chassis, each of the circuit boards is held in the casing in the guide rails and fitting members disposed on the back board.

In the above structure of the circuit board chassis, one end of each of the circuit boards is provided with the front panel, and the other end is held in the fitting members.

In the above structure of the circuit board chassis, the electromagnetic shielding member is provided with a plurality of apertures each having a diameter not larger than ¼ the wavelength of the electromagnetic noise to be shielded.

In the above structure of the circuit board chassis, the electromagnetic shielding member is a plate member plated with an electrically conductive plating.

In the above structure of the circuit board chassis, the electromagnetic shielding member is a plate to which an electrically conductive sheet is adhered.

The present invention also provides one of components for constituting the circuit board module or circuit board chassis, example of which are as follows:

The electromagnetic shielding plate for use in shielding electromagnetic noise entering into and emitting from a circuit board, which comprises an electromagnetic shielding member of electrical conductivity, and a front panel fixed to one end of the electromagnetic shielding member, wherein the front panel and front panel of the circuit board constitute a front wall of the casing to prevent electromagnetic noise from entering the casing.

In the above structure of the electromagnetic shielding plate, the electromagnetic shielding member is provided with a plurality of apertures each having a diameter not larger than ¼ the wavelength of the electromagnetic noise to be shielded.

In the above structure of the electromagnetic shielding plate, the electromagnetic shielding member is a plate member plated with an electrically conductive plating.

In the above structure of the electromagnetic shielding plate, the electromagnetic shielding member is a plate to which an electrically conductive sheet is adhered.

In the following, the first embodiment of the present invention will be explained. FIG. 1 shows a perspective view of the electromagnetic shielding plate, and FIG. 2 shows a perspective view of the circuit board chassis using the shielding plate shown in FIG. 1.

The electromagnetic shielding plate 5 is constituted by, as shown in FIG. 1, an electromagnetic shielding member 1 and an electrically conductive front panel 3 disposed at one end of the shielding member 1. The front panel 3 is provided for preventing incidence of electromagnetic noise in the circuit boards 7 and emission of the electromagnetic noise from the circuit boards 7 as well as to reinforce the electromagnetic shielding member 1. The fastening metal member 4 for fastening the front panel 3 to the electromagnetic shielding member 1 is an electrical conductive material, so that the electromagnetic shielding member 1 and the front panel 3 are electrically conductive. A pair of handles 2 is fixed to the upper and bottom portions of the panel 1, thereby to insert and withdraw the panel 1 into and from the casing 6 easily.

Figure 2:
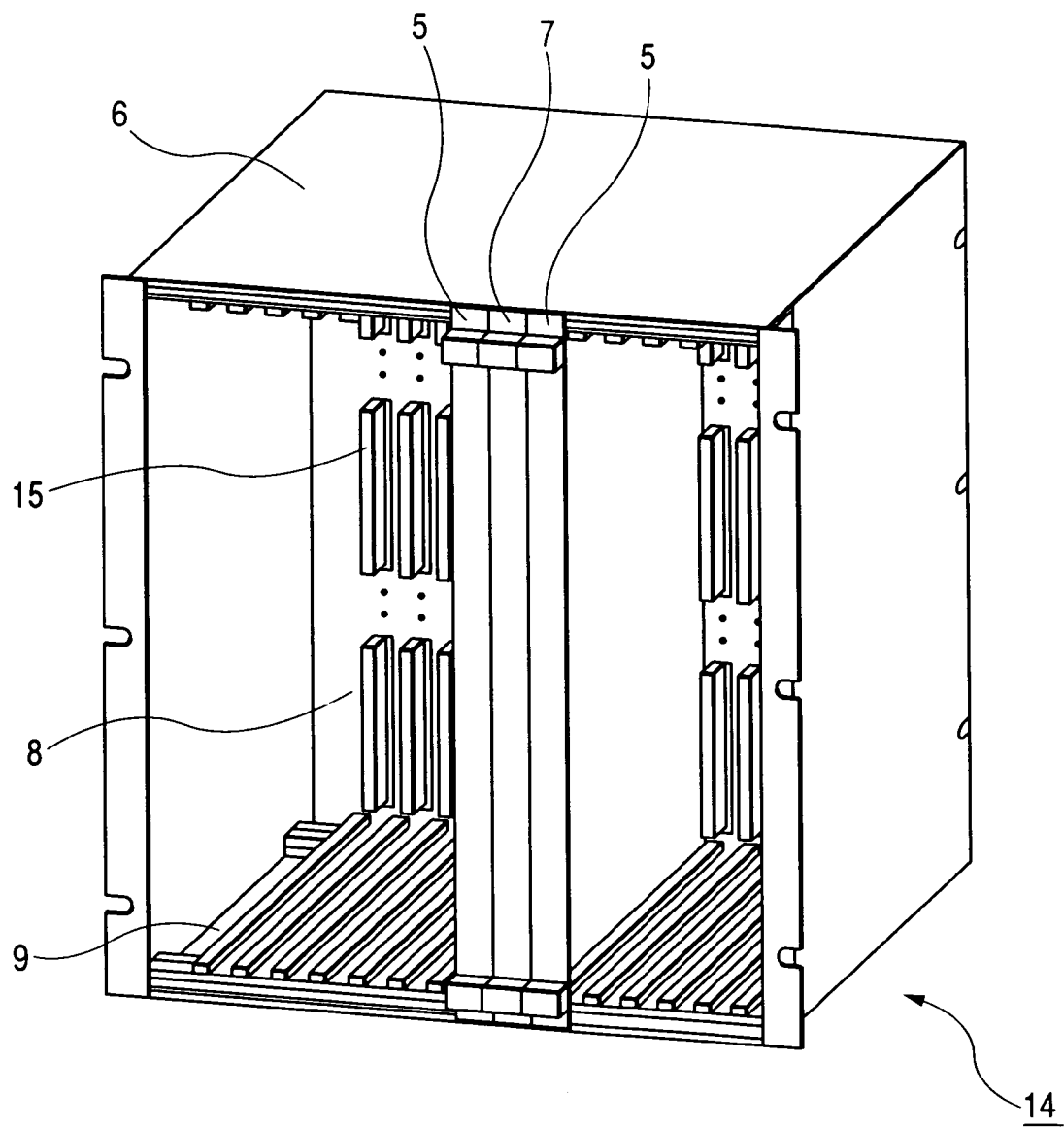
FIG. 2 is a perspective view of the circuit board chassis employing the shielding plate of the first embodiment.

In FIG. 2, the casing 6 is a metal box 14 for mounting the circuit boards 7 therein in parallel with each other, and at the rear side of the box a back board 8 is fixed. The back board 8 is formed of wiring pattern, and connectors are provided to connect the circuit boards 7. The circuit boards 7 constitute electric circuits by electronic components mounted on the circuit boards, and are provided with connectors for connecting the circuits with the back board 8. Guide rails 9 for guiding the circuit boards 7 are disposed on the bottom wall of the casing 6; and the back board 8 is provided with fixing members 15 in parallel with each other. The guide rails and the fixing members stably hold the circuit boards and electromagnetic shielding plates accommodated in the casing. When the circuit boards are inserted along the guide rails 9, the connectors of the back board 8 and of circuit boards are electrically connected.

As shown in FIG. 2, the electromagnetic shielding plates 5 are so inserted into adjoining slots along the guide rails 9 as to sandwich the circuit boards by the plates. After the insertion of the electromagnetic shielding plates 5, the front panels 3 are fixed to the casing 6 with screws. The front panels of the circuit boards and the electromagnetic shielding plates constitute a front shielding wall.

According to this embodiment, because each of the front panels 3 disposed to each of the electromagnetic shielding plates 5 is detachably fixed to the casing 6 with the screws, stable and sure electromagnetic shielding effect can be attained for a long period of time. Further, since the front panel 3 is earthed, it is possible to prevent electromagnetic noise, which enters into the circuit board 7 through the opening for inserting the circuit boards and to shield electromagnetic noise, which is emitted from the circuit boards. The fixing method is not limited to screw fixing for the purpose of fixing and electrical conduction, but other methods such as riveting, clipping, etc are acceptable if theses methods accomplish the above purpose.

Since the electromagnetic shielding panels 5 are earthed by means of the front panels, it is possible to shield electromagnetic noise emitted from the circuit boards, when the electromagnetic shielding plates 5 are inserted into the slots between the circuit boards that mount calculating elements for dealing with high frequency clocks, which may be affected by interference of electromagnetic noise.

Further, since the electromagnetic shielding plates 5 are earthed by means of the front panels, this embodiment may be applied to the casings on the market, such as casings in accordance with standards such as VME; it is possible to apply easily at a low cost without replacing the casings with electrical conductive guide rails.

Further, since the electromagnetic shielding plate 5 can be inserted and withdrawn by itself, maintenance of the circuit boards, such as the measurement, adjustment or repair, etc is done easily and simply. When a plurality of electromagnetic shielding plates 5 is added between the circuit boards, a better shielding effect may be expected.

Further, since the electromagnetic shielding plate 5 can be inserted and withdrawn by itself, the electromagnetic shielding effect may be further enhanced by providing additional electromagnetic shielding plates 5 to vacant slots.

Figure 3:
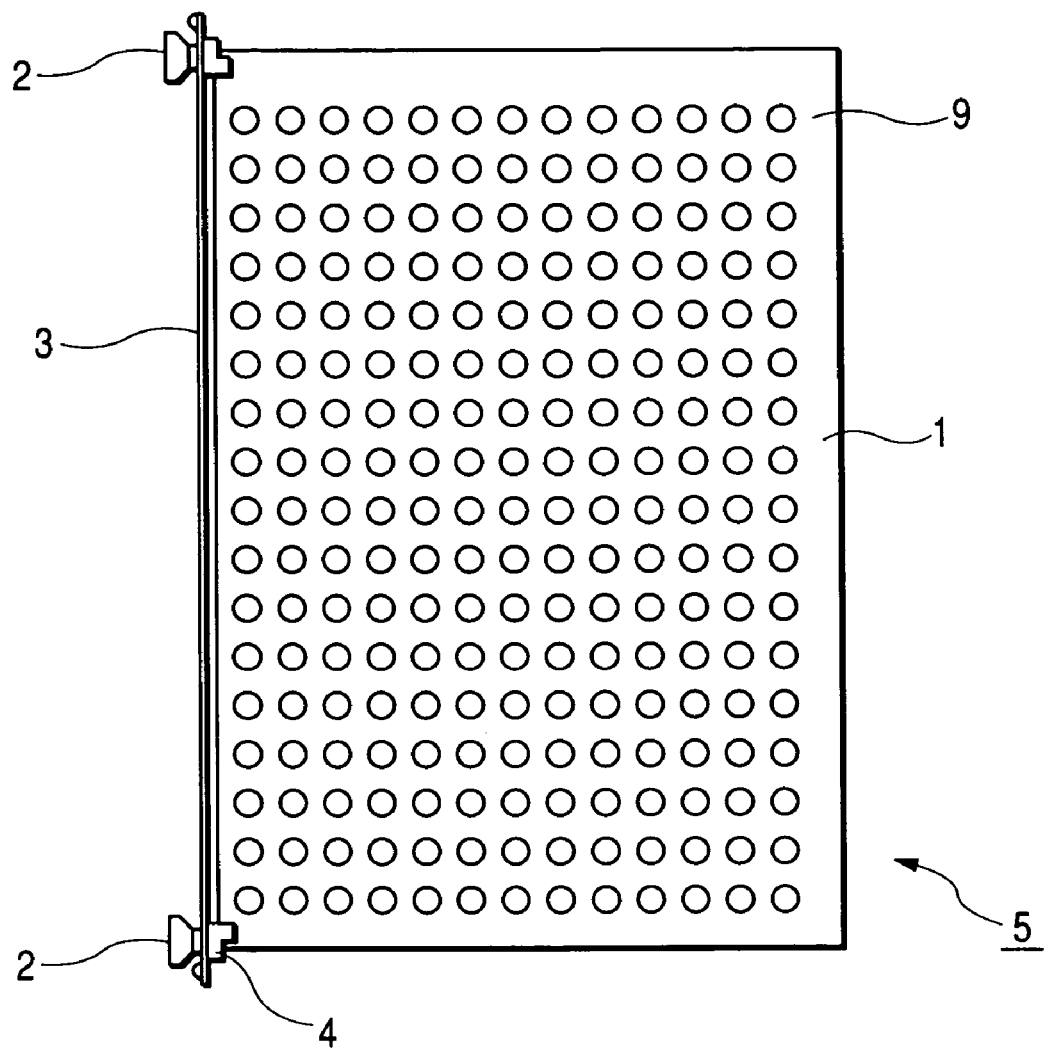
FIG. 3 is a side plan view of an electromagnetic shielding plate of a second embodiment.

The second embodiment of the present invention will be explained. FIG. 3 shows a side plan view of an electromagnetic shielding plate, wherein the plate member 10 is a number of small apertures in s mesh form. The size or diameter of the apertures should be equal to ¼ or less the wavelength of the electromagnetic noise. As well known, if electromagnetic noise enters a metal plate, an eddy current generates in the metal plate. If a number of the apertures are formed in the metal plate 10, eddy currents generated are cancelled each other, thereby to obtain a better electromagnetic shielding effect. In addition to the above, heat generated in the circuit boards is dissipated through the apertures to alleviate an adverse effect on the electronic elements by heat. Further, forming of a large number of apertures makes the electromagnetic shielding plate light-weighted.

Figure 4:
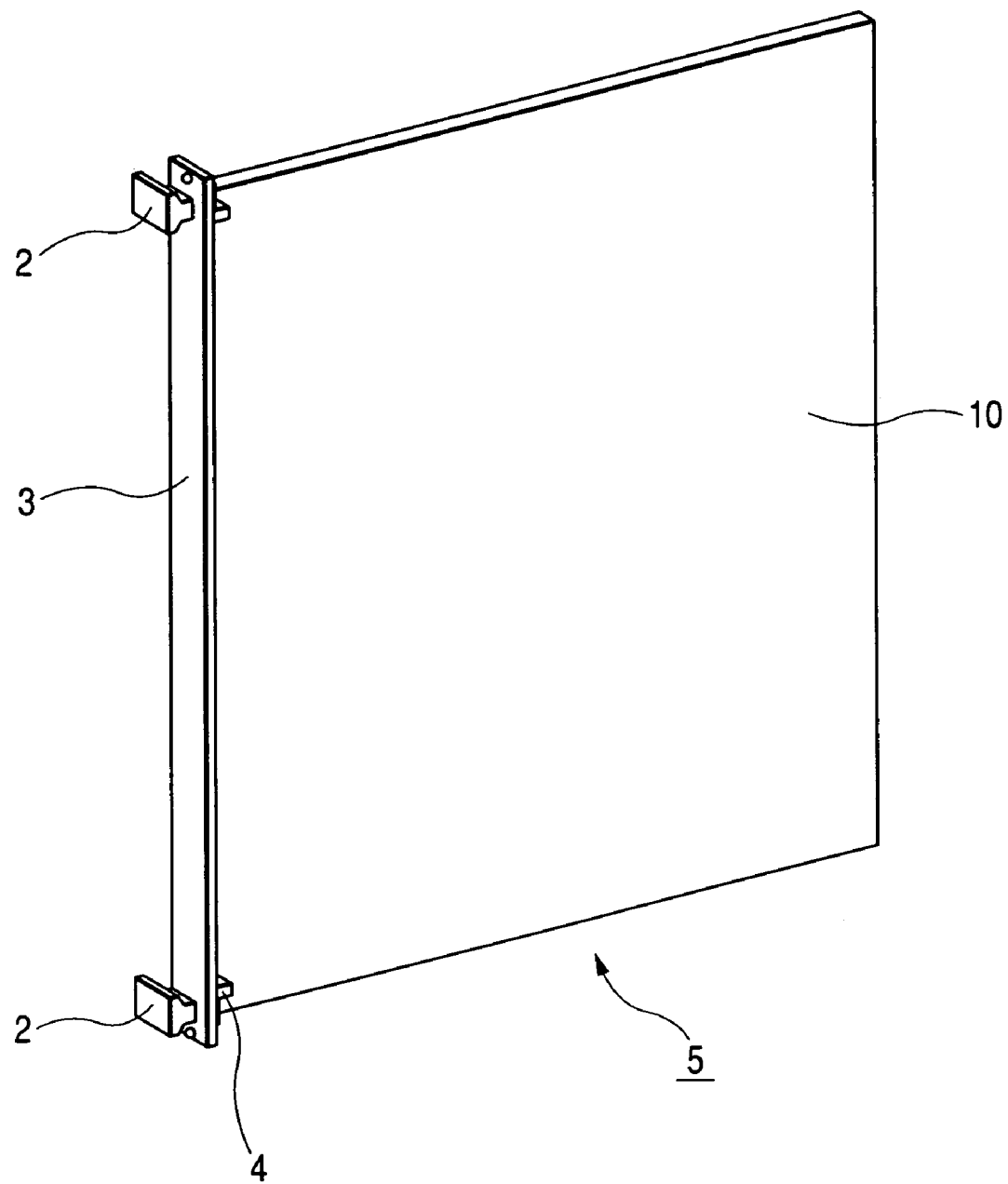
FIG. 4 is a perspective view of an electromagnetic shielding plate of a third embodiment.
Figure 5:
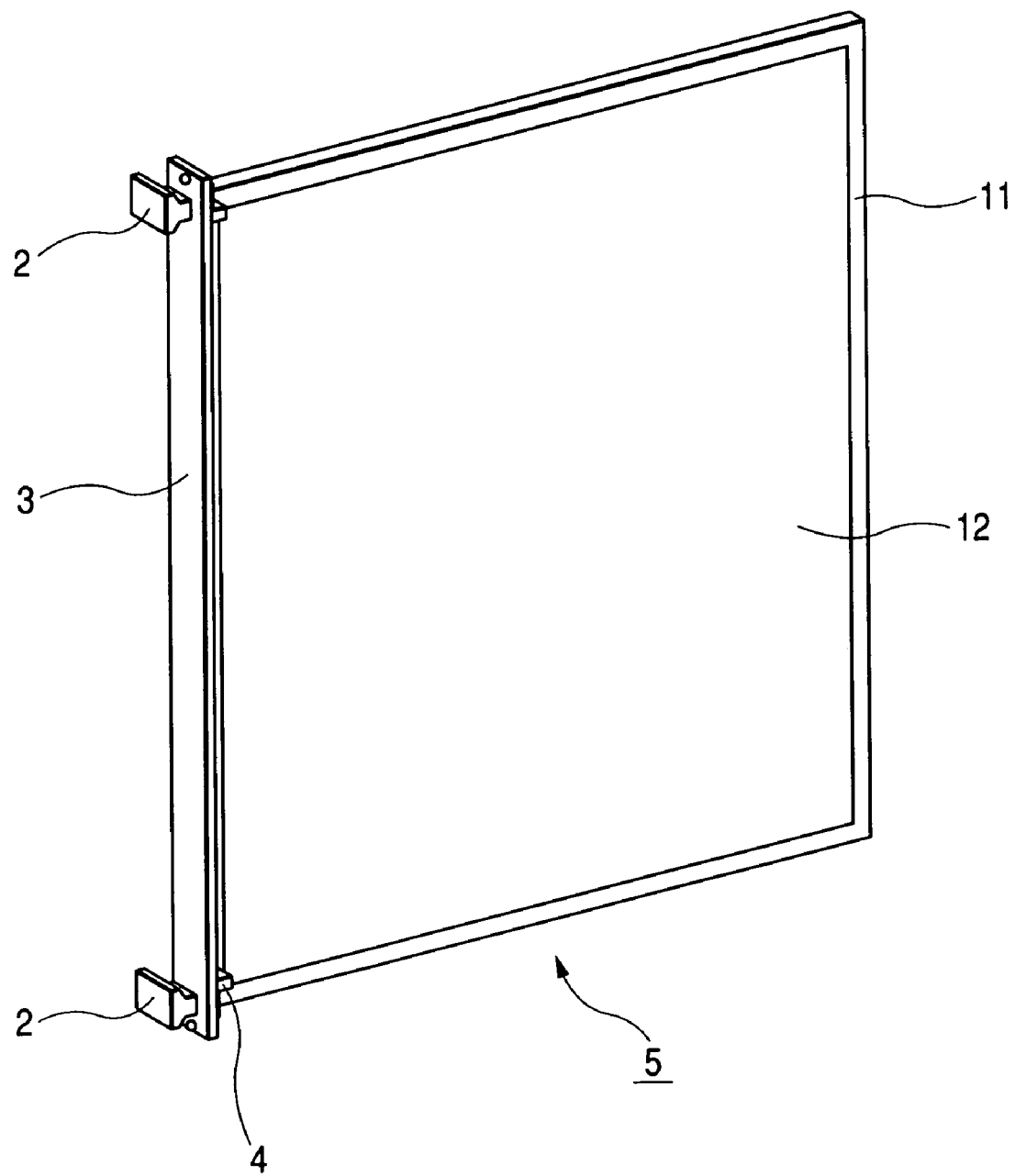
FIG. 5 is a perspective view of an electromagnetic shielding plate of a fourth embodiment.

The third embodiment of the present invention will be explained. FIG. 4 shows a perspective view of an electromagnetic plate of the third embodiment, wherein as the electromagnetic shielding plate, a metal plate 11 plated with gold or a non-metallic plate 11 plated with gold is employed. Particularly, when a plate member made of resin, etc is plated with metal of high electric conductivity such as copper, it is possible to constitute an electromagnetic shielding plate 5 of light weight, keeping the same electromagnetic noise shielding effect as that of the electromagnetic shielding plate of single metal plate. Further, when an electromagnetic shielding sheet 12 is adhered to a metal plate or non-metallic plate 11 to which a metal plating of high electric conductivity such as copper plating is applied, electromagnetic shielding effect is expected. In this case, when a electromagnetic shielding sheet 12 having an electromagnetic shielding performance is employed, a better electromagnetic shielding effect is expected.

When the electromagnetic shielding sheet 12 is adhered to the non-metallic plate member made of resin, etc, the electromagnetic shielding plate is made light-weighted.

As having been described above, since the front panel disposed to the electromagnetic shielding plate and the casing are firmly electrically connected by screwing, the electromagnetic shielding plate is surely earthed, thereby to attain a safe and sure electromagnetic shielding effect for a long period of time.

Further, since the front panel is earthed, it is possible to shield the emitting of electromagnetic noise from the opening for inserting the circuit boards as well as emission of the electromagnetic noise from the circuit boards.

Further, since the electromagnetic shielding plate is earthed by means of the front panel, this structure can be applied to the casings, which use electrically insulating guide rails, at low cost with ease.

Further, since the electromagnetic shielding plate is inserted and withdrawn by itself, maintenance of the measurement, adjustment, repair, etc of the circuit boards is very easy.

Since the electromagnetic shielding plate is inserted and withdrawn by itself, electromagnetic effect is expected when the electromagnetic shielding plates are added by inserting the plates in the vacant slots, if any, in the position where the electromagnetic noise was not considered.

According to the present invention, it is possible to provide an electromagnetic shielding plate and a circuit board chassis having stable and sure electromagnetic shielding effect for a long period of time.

What is claimed is:

1. A circuit board module, which comprises:
   a chassis comprising a casing and guide rails for holding circuit boards;
   a plurality of electromagnetic shielding plates each comprising an electromagnetic shielding member and an electro-conductive front panel fixed to one end of the electromagnetic shielding member; and
   a plurality of circuit boards each mounting electronic components, being located between the electromagnetic shielding plates and being fitted in each of the guide rails, each of the circuit boards having an electro-conductive front panel attached to one end of the circuit board,
   wherein the electromagnetic shielding plates and the casing are electrically connected by means of the front panels, and wherein the front panels of the circuit boards and the electromagnetic shielding plates are arranged in contact with each other to form a front shielding wall of the casing thereby to prevent electromagnetic noise from entering into the casing.

2. The circuit board module according to claim 1, wherein the guide rails are disposed on the walls of the inside of the casing.

3. The circuit board module according to claim 1, wherein the casing is constituted by top and bottom walls, a pair of side walls and a back board to form a rectangular space.

4. The circuit board module according to claim 3, wherein the back board having fitting members extending near the top wall in the vertical direction, in aligned relation with the guide rails.

5. The circuit board module according to claim 4, wherein a plurality of electromagnetic shielding plates each having an electromagnetic shielding members extending over substantially the whole length of the circuit boards to cover the circuit boards, the plates being fixed in the guide rails and the fitting members and inserted between the circuit boards thereby to shield the circuit boards.

6. The circuit board module according to claim 1, wherein the casing is constituted by a top wall, a bottom wall to which guide rails for guiding the circuit boards are provided, two side walls and a back board, whereby a rectangular space for accommodating the circuit boards is formed in the casing, wherein the back board has a plurality of fitting members arranged in parallel with each other, aligned with the guide rails and extending near the top wall in the vertical direction, thereby to hold the circuit boards and the electromagnetic shielding plates in the casing.

7. The circuit board module according to claim 1, wherein each of the electromagnetic shielding members has an plan area covering substantially the whole plan area of each of the circuit boards, when the circuit boards are held in the casing.

8. The circuit board module according to claim 3, wherein each of the front panels has a stripe form fixed to one end of the shielding member and extending near the top wall in the vertical direction, a pair of handles being disposed at a top and bottom points of the stripe.

9. The circuit board module according to claim 1, wherein the electromagnetic shielding member is provided with a plurality of apertures each having a diameter not larger than 1/4 the wavelength of the electromagnetic noise to be shielded.

10. The circuit board module according to claim 1, wherein the electromagnetic shielding member is a plate member plated with an electrically conductive plating.

11. The circuit board module according to claim 1, wherein the electromagnetic shielding member is a plate to which an electrically conductive sheet is adhered.

12. A circuit board chassis, which comprises:
a casing constituted by a top wall, a bottom wall, two side walls and a back board to form a space, the inner bottom wall of the casing being provided with a plurality of guide rails in parallel with each other with a gap;
a plurality of electromagnetic shielding plates to be inserted in the casing by means of the guide rails; and
a plurality of circuit boards to be inserted between the plurality of electromagnetic shielding plates in the space of the casing along the guide rails, wherein the plurality of electromagnetic shielding plates and the circuit boards are detachably connected by means of front panels, wherein each of the plurality of electromagnetic plates comprises an electromagnetic member and an electro-conductive front panel fixed to one end of the electromagnetic shielding member by means of fixing members at top and bottom positions of the front panel, and each of said plurality of circuit boards comprises an electro-conductive front panel attached to one end thereof, and wherein the front panels and the casing are electrically connected,
and wherein the front panels of the plurality of circuit boards and of the plurality of electromagnetic shielding plates are adapted to be arranged in contact with each other to form a front shielding wall to thereby prevent electromagnetic noise from entering into the casing.

13. The circuit board chassis according to claim 12, wherein each of the circuit boards is held in the casing in the guide rails and fitting members disposed on the back board and extending near the top wall.

14. The circuit board chassis according to claim 12, wherein the other end of each of said plurality of circuit boards is held in fitting members disposed on the back board.

15. The circuit board chassis according to claim 12, wherein the central part of the electromagnetic shielding member is provided with a plurality of apertures each having a diameter not larger than 1/4 the wavelength of the electromagnetic noise to be shielded.

16. The circuit board chassis according to claim 12, wherein the electromagnetic shielding member is a plate member plated with an electrically conductive plating.

17. The circuit board chassis according to claim 12, wherein the electromagnetic shielding member is a plate to which an electrically conductive sheet is adhered.

18. An electromagnetic shielding plate for use in shielding electromagnetic noise entering into and emitting from a circuit board, which comprises:
an electromagnetic shielding member of electrical conductivity;
a front panel fixed to one end of the electromagnetic shielding member
a plurality of circuit boards having front panels, wherein the electromagnetic shielding plate and the plurality of circuit boards are detachably and electrically connected by means of the front panels, and
wherein the front panels of the shielding member and of the plurality of circuit boards are arranged in contact with each other to constitute a front shielding wall of the casing thereby to prevent electromagnetic noise from entering the casing, when inserted into a space of a casing for the plurality of said circuit boards and the shielding member.

19. The electromagnetic shielding plate according to claim 18, wherein the central part of the electromagnetic shielding member is provided with a plurality of apertures each having a diameter not larger than 1/4 the wavelength of the electromagnetic noise to be shielded.

20. The electromagnetic shielding plate according to claim 18, wherein the electromagnetic shielding member is a plate member plated with an electrically conductive plating.

21. A circuit board module, which comprises:
a chassis comprising a casing, guide rails disposed on a bottom face of an inside of the casing for inserting circuit boards;
at least one electromagnetic shielding plate comprising an electromagnetic shielding member and a front panel fixed to one end of the electromagnetic shielding member, wherein the electromagnetic shielding plate is located beside a circuit board; and
a plurality of circuit boards, mounting electronic components, which are inserted into the casing along the guide rails, wherein the at least one electromagnetic shielding plate and the plurality of circuit boards are detachably and electrically connected by means of front panels,
wherein the front panels of each of said plurality of circuit boards and the at least one electromagnetic shielding plate are arranged in contact with each other to form a shielding wall to thereby prevent electromagnetic noise from entering into the casing.

22. The circuit board module according to claim 21, wherein the electromagnetic shielding plate is capable of being inserted into and withdrawn from the casing by itself.

23. A circuit board module, which comprises:
a chassis comprising an electrically conductive casing, and guide rails disposed on a bottom face of an inside of the casing for inserting circuit boards;
a plurality of electromagnetic shielding plates each comprising an electromagnetic shielding member plate and a front panel fixed to one end of the electromagnetic shielding member plate, wherein the electromagnetic shielding plate is inserted along the guide rails; and a plurality of circuit boards having front panels, mounting electronic components, which are inserted into the casing along the guide rails, wherein the electromagnetic shielding plate and the circuit boards are electrically connected by means of the front panels of the electromagnetic shielding plates, wherein the front panels of each of the plurality of circuit boards and the plurality of electromagnetic shielding plates are arranged in contact with each other to form a front shielding wall to thereby prevent electromagnetic noise from entering into the casing.

24. The circuit board module according to claim 22, wherein the electromagnetic shielding plate is capable of being inserted into and withdrawn from the casing by itself.

* * * * *